United States Patent [19]

Kosa et al.

[11] Patent Number: 5,158,901
[45] Date of Patent: Oct. 27, 1992

[54] FIELD EFFECT TRANSISTOR HAVING CONTROL AND CURRENT ELECTRODES POSITIONED AT A PLANAR ELEVATED SURFACE AND METHOD OF FORMATION

[75] Inventors: Yasunobu Kosa; W. Craig McFadden; Keith E. Witek, all of Austin, Tex.

[73] Assignee: Motorola, Inc., Schaumburg, Ill.

[21] Appl. No.: 767,964

[22] Filed: Sep. 30, 1991

[51] Int. Cl.⁵ .......................................... H01L 21/265
[52] U.S. Cl. ........................................ 437/40; 437/29; 437/35; 437/41; 437/59; 437/89; 437/913; 148/DIG. 53
[58] Field of Search ............... 437/40, 41, 28, 29, 437/52, 59, 89, 99, 913; 148/DIG. 53; 357/23.4

[56] References Cited

U.S. PATENT DOCUMENTS

| | | | |
|---|---|---|---|
| 3,938,241 | 2/1976 | George et al. | 437/228 |
| 4,849,369 | 7/1989 | Jeuch et al. | 437/52 |
| 5,001,078 | 3/1991 | Wada | 437/52 |
| 5,079,180 | 1/1992 | Rodder et al. | 437/41 |

FOREIGN PATENT DOCUMENTS 0175433 3/1986 European Pat. Off. ............ 357/23.4

OTHER PUBLICATIONS

"Impact of Surrounding Gate Transistor (SGT) for Ultra-High-Density LSI's," by H. Takato et al., IEEE Transactions on Electronic Devices, vol. 38, Mar. 1991, pp. 573-577.

Primary Examiner—Brian E. Hearn
Assistant Examiner—Michael Trinh
Attorney, Agent, or Firm—Robert L. King

[57] ABSTRACT

A field effect transistor having regions (20, 20', and 20'') which respectively function as a planar elevated surface for gate, drain, and source electrical contact, and method of fabrication. The transistor overlies a substrate (12) and is formed partially from active areas (14 and 14'). The regions (20, 20', and 20''), each underlie or are surrounded by a dielectric layer (22). A gate is formed by a gate layer (24). A source (30) is formed within region (20'') and is electrically connected to active area (14'). A drain (30') and channel region are formed within region (20'). Electrical contact is made to the source (30), drain (30') and gate layer (24) by conductive layers (34'', 34', and 34, respectively).

8 Claims, 8 Drawing Sheets

FIELD EFFECT TRANSISTOR HAVING CONTROL AND CURRENT ELECTRODES POSITIONED AT A PLANAR ELEVATED SURFACE AND METHOD OF FORMATION

FIELD OF THE INVENTION

The present invention relates generally to semiconductor electronics, and more particularly, to field effect transistors (FETs).

BACKGROUND OF THE INVENTION

Improved device performance and increased circuit density have been long-lasting goals of the integrated circuit industry. More specifically, for metal oxide semiconductor (MOS) field effect transistors (FETs), which are hereafter generalized as FETs, the industry has tried to improve device performance in many ways, such as: (1) increasing device electrical isolation; (2) reducing leakage current; (3) reducing capacitance to increase device switching speed and therefore improved the speed of operation; (4) improving device lifetime; (5) improving device current carrying capability; (6) reducing short channel behavior; (7) increasing circuit density; (8) reducing threshold voltage (Vt) shifts; and (9) reducing device dimensions.

To improve semiconductor devices, in some of the areas mentioned above, the industry began researching semiconductors on three-dimensional structures, such as vertical transistors. Most successful vertical transistor technologies involve the growth or deposition of a thin region of semiconductor material, such as silicon, for use as a FET channel and in some cases for use as a source region and a drain region. The channel is contained by dielectrics having perimeters requiring isolation and is placed adjacent to the source region and the drain region. The source and drain regions are always a conductive or semiconductive material to allow for FET current flow and device operation.

Another process technology, known as epitaxial growth, has been studied and used to improve the performance of semiconductor devices. Epitaxial growth is a crucial step for most vertical transistor processes. Epitaxy, when interpreted literally means "arranged upon," in a more relevant manner is the growth on a crystalline substrate of a crystalline substance that copies the orientation of the substrate.

The combination of vertical transistor technology and silicon epitaxial growth has produced devices, such as complex three-dimensional devices and surrounding gate devices, that have enhanced capability or performance. An example of a performance improving structure is the surrounding gate transistor (SGT). The SGT structure is a vertical stacked transistor with a conductive gate that surrounds a vertical semiconductor channel region. The SGT improved transistor performance in many of the ways listed above but had a few disadvantages. The SGT structure, as well as all other known and complex vertical epitaxially formed transistor structures, have the disadvantages of: (1) the gate, source and drain are difficult to make contact to with overlying conductive layers, such as metal layers; (2) a gate polysilicon bottom electrode prevents the impurity doping of the source and the drain; and (3) the SGT device is not capable of dimension reduction into smaller submicron ranges due to contact problems.

SUMMARY OF THE INVENTION

The previously mentioned disadvantages are overcome and other advantages achieved with the present invention. In one form, the present invention comprises an MOS transistor formed by a process of providing a substrate of a first conductivity type which has a surface. A first and a second region of a second conductivity type are formed in the substrate material separated by a first insulator. A control electrode region is formed from the first region. Separate first and second current regions overlying the second region are formed. The first current region being single crystalline formed from the substrate material and having the first conductivity type. The control electrode region and the first and second current regions being elevated above the surface of the substrate material. A second insulator overlying all exposed surfaces is formed. A conductive material is formed overlying all exposed surfaces. The conductive material overlying the second current region and the conductive material overlying an upper portion of the first current region is removed, forming a control electrode from a remainder of the conductive layer. A portion of each of the first and second current regions is doped with the second conductivity respectively forming a first current electrode and a second current electrode a channel region is defined around a perimeter of the first current region between the first current electrode and the second region of the second conductivity type. Electrical contact is made to the control electrode and the first and second current electrodes.

The present invention will be understood by one skilled in the art from the detailed description below in conjunction with the accompanying drawings.

DESCRIPTION OF THE PREFERRED EMBODIMENT

As stated herein, vertical transistors and epitaxial technologies have allowed advances in device performance and contributed to many advances in process technology. Devices resulting from vertical transistor technology and epitaxial technology are more difficult to manufacture with consistent success than conventional planar transistors. It would be advantageous to have a device and a process that provides all the advantages of vertical transistor formations and epitaxial technology, such as: (1) increasing device electrical isolation: (2) reducing leakage current; (3) reducing capacitance to increase device switching speed and therefore improving the speed of operation; (4) improving the device lifetime; (5) improving device current carrying capability; (6) reducing short channel behavior; (7) increasing circuit density; (8) reducing threshold voltage (Vt) shifts; and (9) reducing device dimensions, while the same manner having the added advantages of being more useful and easier to manufacture in terms of: (1) an easy to manufacture and reliable gate, source and drain contact to overlying conductive layers, such as metal layers; (2) a polysilicon gate or conductive control electrode that protects a channel region while allowing the impurity doping of current electrodes, referred to as a source and a drain; and (3) a device that is capable of dimension reduction into smaller submicron ranges.

Figure 1A:
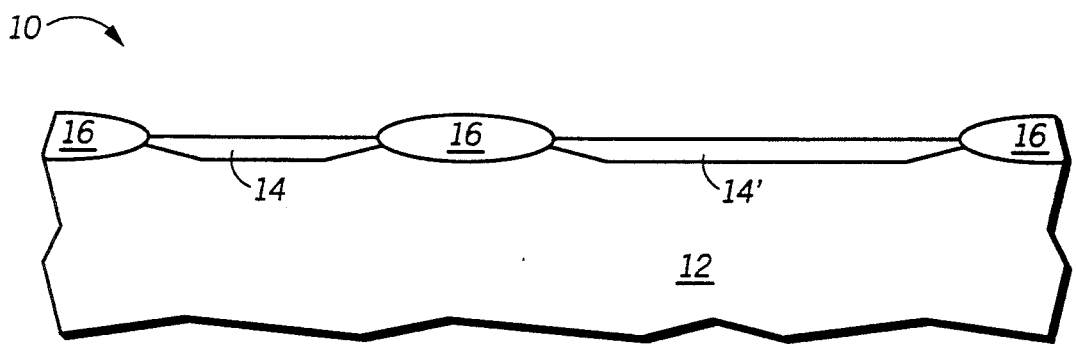
FIGS. 1A-1H illustrate, in cross-sectional form, a process for making a field effect transistor in accordance with the present invention.

Illustrated in FIGS. 1A-1H is a process flow for providing a field effect transistor in accordance with the present invention and having the advantages discussed above. It should be well understood that the figures illustrated herein may not be drawn to scale, and in some cases, are purposely not in exact proportion to better illustrate specific regions. FIG. 1A depicts a device 10. Device 10 has a substrate 12, of a first conductivity and having a surface which for most applications is a silicon substrate but can also be an epitaxial layer of material, Germanium (Ge) or any other semiconductor material. First and second regions of a second conductivity type, referred to respectively as active region 14 and active region 14', are formed. Active regions are areas from which active devices, such as transistors, are to be made. Active regions, such as active regions 14 and 14' are defined and formed in most cases by an insulator or dielectric mask, such as nitride. The dielectric mask is deposited or grown over the substrate 12, and openings are formed in the dielectric mask by conventional techniques. The areas of the substrate 12 exposed by the openings in the dielectric mask are then exposed to dopant impurities through known techniques, such as ion implantation or diffusion technology. The dopant impurities change the conductivity of the substrate forming the active areas 14 and 14'. A dielectric mask layer similar to the dielectric mask layer used for formation of active areas 14 and 14' is used to form a dielectric layer 16. Dielectric layer 16, for most applications, is a thermally grown oxide and is a first insulator used to separate active region 14 from active region 14'. Dielectric layer 16 is also used to isolate device 10 from other devices that may exist in nearby regions.

Figure 1B:
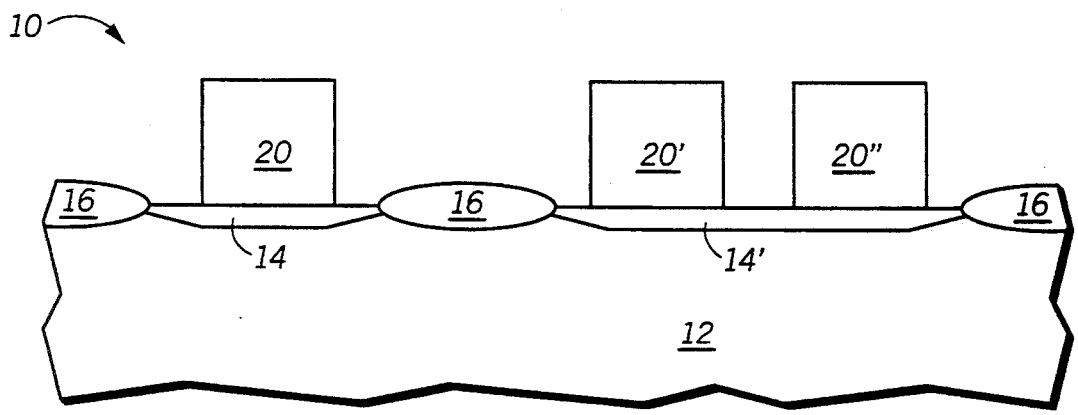
Figure 1C:
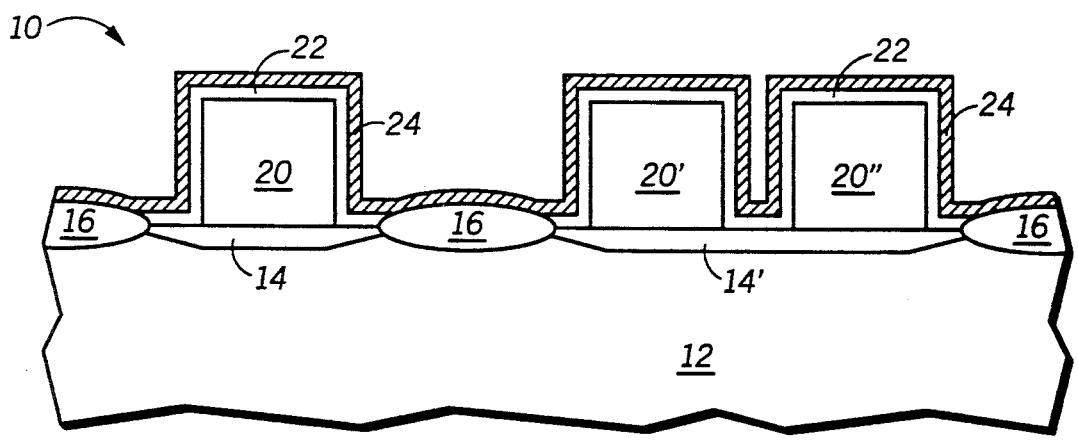

FIG. 1B illustrates the formation and position of three "pillar-like" stacks of material. These three stacks are respectively referred to as regions 20, 20', and 20", and, in one form, are illustrated and referred to as being grown epitaxially. Reference to made to these formations as being epitaxial because it is the most manufacturable way to create these formations. Although reference is made to these formations as being epitaxial structures for the process flow depicted in FIGS. 1A-1H, the regions 20, 20', and 20" are not limited to epitaxial formations. The only region that is of a single crystalline substrate-like form, and therefore epitaxial in origin, is region 20' because it contains a channel region along with a drain. Region 20 can be made of any material such as oxide, polysilicon, epitaxial material or a combination of any of these materials. This is due to the fact that the electrical properties of region 20 are not critically important, and region 20 usually only serves as a physical gate support structure and occasionally a gate capacitance control structure. Region 20" is used to physically support and electrically contact a source of device 10 and therefore must be conductive. For example, region 20" can be made of polysilicon, epitaxial silicon, or a similar material that can be used to electrically contact a source to the active region 14'.

In more detail, a control electrode region or region 20 is formed from active region 14. Although region 20 is illustrated as overlying the active region 14, region 20 can be physically positioned elsewhere. For example, region 20 can be located entirely overlying the dielectric layer 16. In most cases, the region 20 is formed from or epitaxially grown from an active region, such as active region 14. Region 20 is used to physically support a control electrode, also known as a gate electrode, and will also allow for gate electrode electrical contact to overlying layers.

A first current region, referred to as region 20', is an epitaxial region similar in physical dimensions to region 20 and is similar in mechanical/electrical characteristics to region 20 if region 20 is epitaxially grown. Region 20' will be used to function as a channel region for device 10. A channel region is a region of substrate or similar material that separates a source and a drain. In the transistor "on" state, the channel regions carries current between the source and the drain. In the "off" state the channel region provides isolation between the source and the drain to prevent current flow. An upper portion of region 20' is used to form a current electrode or a drain formation for device 10.

A second current region, referred to as region 20", is usually an epitaxial region similar in physical dimensions to region 20 and is similar in mechanical/electrical characteristics to region 20, if region 20 and region 20" are of the same material. Region 20" is used to physically support and aid in electrical contact of a current electrode or a source for the field effect transistor (FET) referred to as device 10. It should be noted that the name "current electrode" refers to a source or a drain of an FET. It is also important to note that, in most cases, a source and drain are physically and electrically equivalent and therefore, the regions labeled as a source and a drain can usually be interchanged without affecitng the functionality of an FET.

Regions 20, 20', and 20" can be formed in many ways. Referring to FIGS. 3A-3A (a discussion of FIG. 2 and remaining portions of FIG. 1 will follow below), a method for forming regions 20, 20', and 20" is illustrated in FIGS. 3A-3B, FIG. 3A depicts a structure similar to that previously described and illustrated in FIG. 1A with respect to substrate 10, active areas 14 and 14', and dielectric layer 16. To form regions 20, 20', and 20", a "blanket" epitaxial layer 17 is grown. A "blanket" layer or planar growth means that the epitaxial growth is not at all restricted and is free to cover any and all areas exposed for coverage, such as all of dielectric layer 16. A masking layer 18 is formed overlying portions of the epitaxial layer 17 using conventional techniques and can be any conventional masking material, such as an oxide or a photoresist. The portions of epitaxial layer 17 not covered by masking layer 18 are removed by a chemical or physical etch procedure, such as reactive ion etching (RIE). After the removal of epitaxial layer 17, masking layer 18 is removed thereby forming regions 20, 20' and 20" as illustrated in FIG. 3B or FIG. 1B. It is important to mentioned again that region 20' is the only region that must be single crystalline. Therefore, this procedure, another epitaxial procedure or a similar single crystalline formation step must be used for at least region 20'.

Figure 4A:
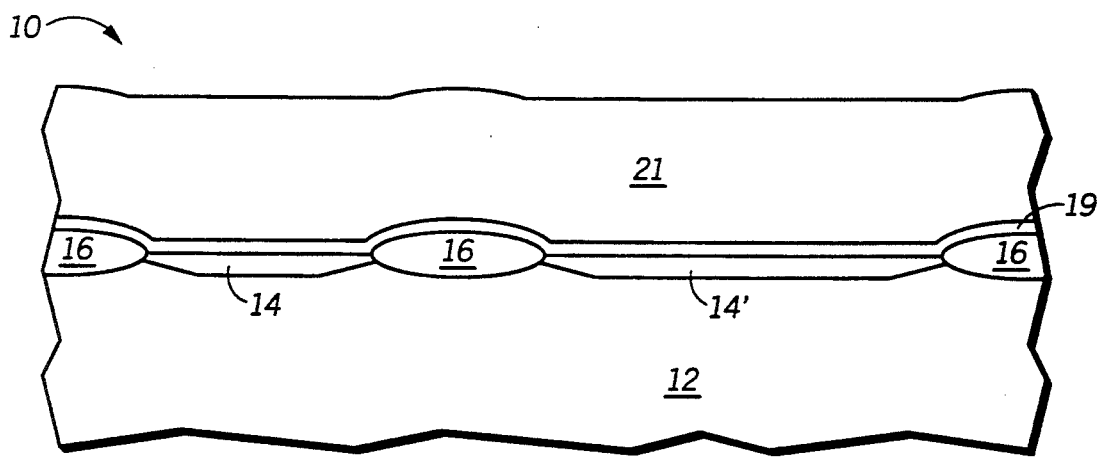
FIGS. 4A-4C illustrate, in cross-sectional form, yet another embodiment for forming a control electrode region and first and second current regions of the transistor of FIG. 1.
Figure 4B:
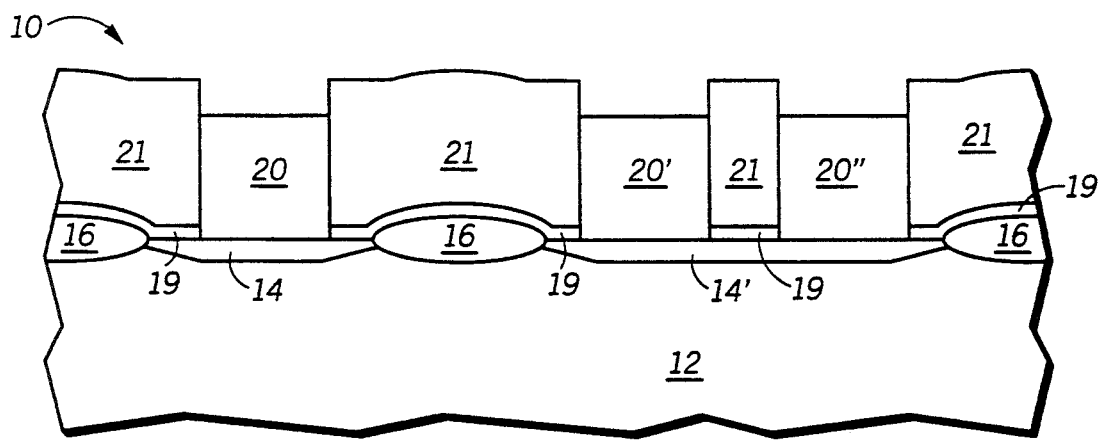
Figure 4C:
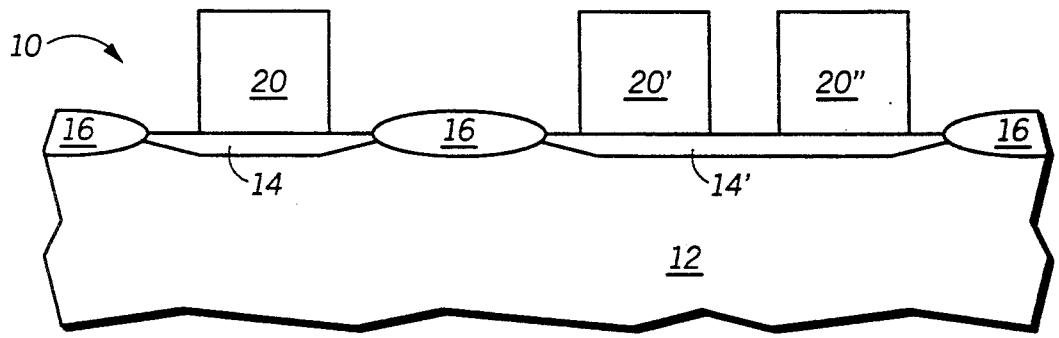

Yet another method, referred to as selective epitaxial growth, for forming regions 20, 20' and 20" is illustrated in FIGS. 4A-4C. FIG. 4A depicts a structure similar to that previously described and illustrated in FIG. 1A with respect to substrate 10, active areas 14 and 14', and dielectric layer 16. A layer 19 of material is deposited or formed overlying dielectric layer 16 and active areas 14 and 14'. Layer 19 must be capable of being removed or etched away without significant removal, etching, deformation, or harm to dielectric layer 16 and active areas 14 and 14'. In other words, dielectric layer 16 must be capable of being removed or etched away selective to dielectric layer 16 and active areas 14 and 14'. Because of the removal selectivity criterion, layer 19 can be, for example, a nitride layer.

A layer 21 of material is then deposited overlying layer 19. Layer 21 must be capable of being removed selective to layer 19. For example, if layer 19 is nitride, layer 21 can be an oxide layer, such as an oxide formed by tetra-ethyl-ortho-silicate (TEOS) or boro-phosphate-silicate-glass (BPSG), and be highly selective when removed.

Openings in layer 21 are formed using conventional selective each techniques which expose portions of layer 19. The exposed portions of layer 19 are then etched selective to active regions 14 and 14' to expose portions of active regions 14 and 14'. These openings are illustrated in FIG. 4B. Selective epitaxial growth is then used to form at least region 20'and could form some combination of regions 20, 20', and 20". After all epitaxial formation is complete, layer 21 is removed selective to layer 19. Layer 19 is removed selective to dielectric layer 16 and active areas 14 and 14'. Selective removal is needed and desirable to prevent damage to the underlying active areas 14 and 14' and dielectric layer 16. The removal of layers 21 and 19 is illustrated in FIG. 4C or FIG. 1B. An optional protective layer (not depicted) can be formed overlying all epitaxial regions, which could be any combination of regions 20, 20', and 20", but must include region 20', to reduce or prevent damage of these critical regions during the removal of layers 21 and 19.

If any of regions 20, 20', and 20" are not formed epitaxially, they are formed at this point in the process by conventional formation techniques. Any of the regions 20, 20', and 20" which are epitaxial can be in-situ, defined as "during growth", doped with dopant impurities to affect the channel region's electrical characteristics. This doping can be useful for applications where the threshold voltage (Vt) needs to be altered or maintained consistently at a constant voltage value.

Returning now to FIG. 1, FIG. 1C illustrates the formation, by deposition or growth, of a second insulator, referred to as dielectric layer 22, which is usually formed over all exposed surfaces but only has to be formed over the active areas 14 and 14' and the regions 20, 20', and 20". A conductive material or semiconductive gate layer 24, which for most applications is polysilicon, is formed overlying the dielectric layer 22 and dielectric layer 16, if dielectric layer 16 is exposed.

Figure 1D:
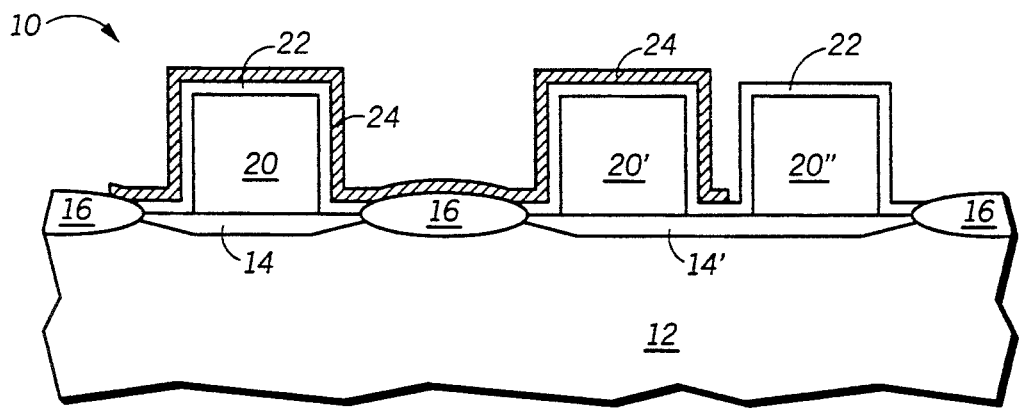

A portion of gate layer 24 overlying and surrounding an area around a periphery of region 20" is removed using conventional techniques and is depicted in FIG. 1D. Portions of gate layer 24 overlying dielectric layer 16 are also removed along with any other portions of gate layer 24 that are not needed or which could cause electrical problems.

Figure 1E:
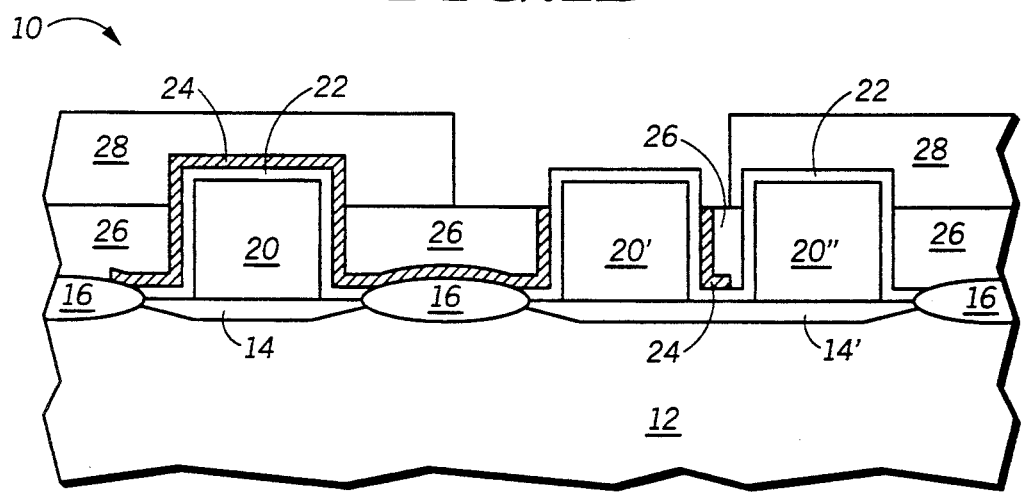

A mask layer 26, which is usually a polymer or photoresist, as formed in the topography between the regions 20, 20' and 20", as illustrated in FIG. 1E. Mask layer 26 can be formed by known techniques of spinning, baking, etch-back, and planarization. An additional masking layer 28 is formed overlying masking layer 26 and other exposed areas such as the gate layer 24 which overlies region 20 and dielectric layer 22 which overlies region 20". Together, masking layers 26 and 28 expose the upper portion of gate layer 24 which surrounds a periphery of region 20' while protecting all other layers and portions of gate layer 24. The exposed portion of gate layer 24 overlying region 20' is removed or etched away. A cylinder or partial-cylinder of gate layer 24 is left surrounding a periphery of regions 20'. The masking layers 26 and 28 are then removed using conventional techniques. The resulting gate layer 24 forms a gate for device 10.

The resulting gate layer 24, which forms an electrical gate for the device 10, covers a larger substrate surface area than most conventional FETs. A larger covered substrate surface area means that the capacitive coupling effects that are known and understood for FET gates will be increased. This is not always a disadvantage and in some cases the larger surface area gate of device 10 is an advantage. Several memory cells manufactured in the integrated circuit industry, such as fast static random access memory (FSRAM) and dynamic random access memory (DRAM), not only require a gate capacitance but require a controllable or uniform gate capacitance from device to device. The device 10 can have a very controllable gate capacitance by ion implanting dopant impurities into the region 20 or by controlling the mechanical, chemical, and physical properties of dielectric layer 22, gate layer 24 or region 20. Therefore device 10 has a direct advantage when used for some memory applications.

Figure 1F:
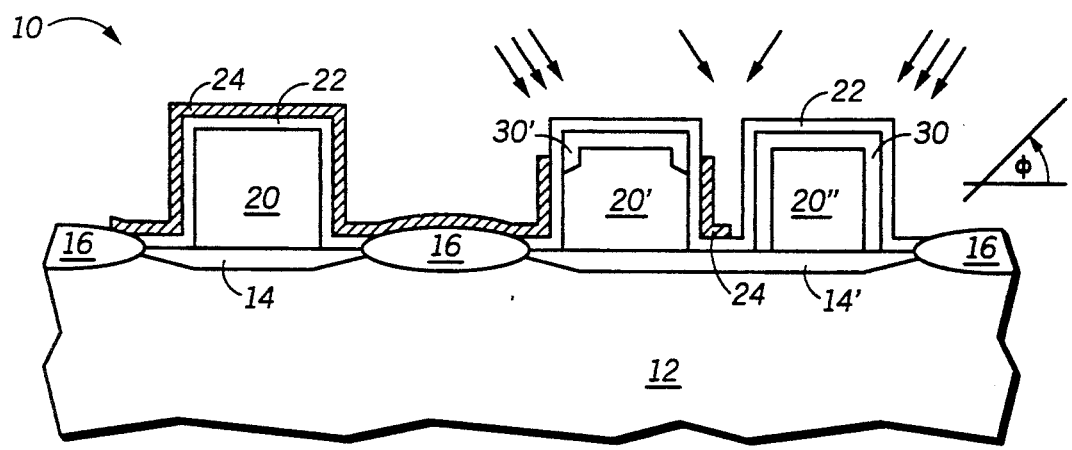

Illustrated in FIG. 1F, a tilt-angle rotational implant technique or a diffusion step is used to form a first current electrode and a second current electrode, respectively referred to as a source 30 and a drain 30', within the regions 20' and 20". A tilt-angle rotational implant is utilized wherein wafers are held at an angle between forty-five and eighty degrees reference to $\Phi$ in FIG. 1F. The wafers are physically spun as they are injected with dopant impurities, in order to form a source and drain with the proper physical shapes. The source 30 covers a majority of the top portion of region 20", and also makes physical contact and therefore electrical contact to active region 14'. This contact makes active area 14' an electrical extension of the source 30. The drain 30' is self-aligned to the gate layer 24, meaning that the drain 30' is formed after the gate layer 24 and therefore the drain 30' formation is limited and aligned in a region not covered by the gate layer 24. The area within region 20' that lies between the drain 30' and the active area 14' along the surface of the dielectric layer 22 is defined to be a channel region.

Figure 1G:
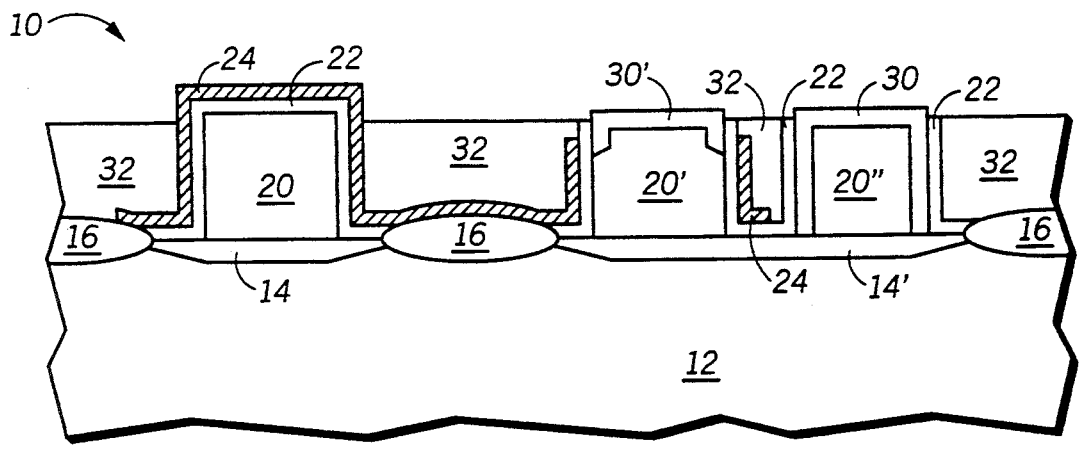
Figure 1H:
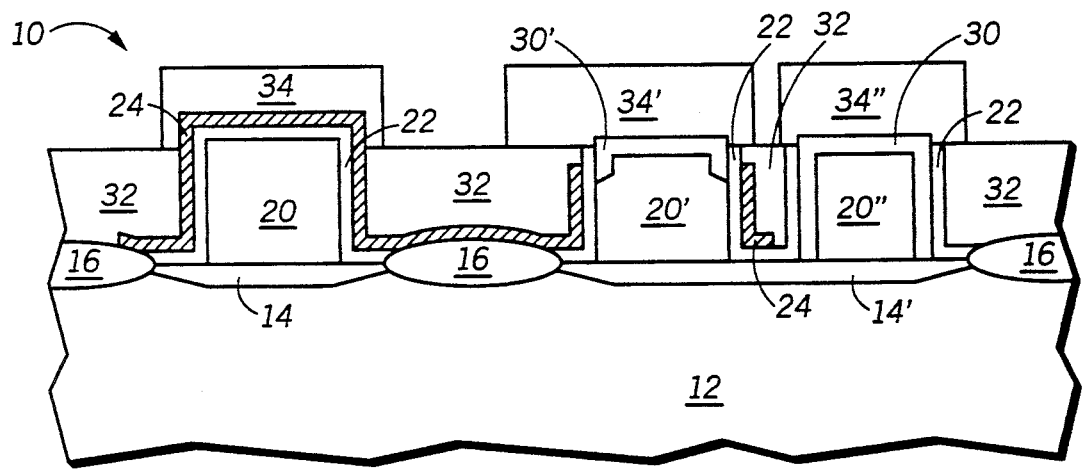

Illustrated in FIG. 1G, a dielectric layer 32 is formed, for example by deposition of BPSG, with the underlying gate layer 24 being protected from BPSG impurities by a thin undoped oxide or an equivalent layer. The dielectric layer 32, which is put through a process of reflow to make coverage more planar, is etched-back to expose the source 30, the drain 30' and the gate layer 24, which overlies the region 20 and now forms the gate of the FET. As illustrated in FIG. 1H, these exposed surfaces are used to form electrical contacts via one of a plurality of conductive layers 34, 34', and 34". Conductive layers 34, 34', and 34" may be a metal, polysilicon, or a compound containing metal or a semiconductor. Specifically, conductive layer 34 makes electrical contact to the gate of device 10. Conductive layer 34' makes electrical contact to drain 30', and conductive layer 34" makes electrical contact to source 30. It is important to note that the three conductive layers 34, 34', and 34" do not have to be formed from the same material or layer of material.

Figure 2:
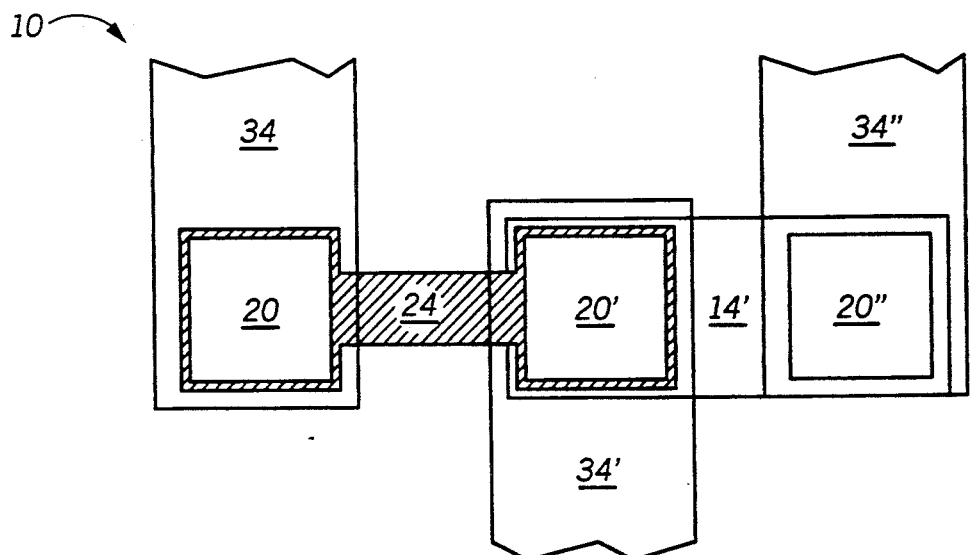
FIG. 2 illustrates a top elevation perspective view of a field effect transistor in accordance with the present invention.
Figure 3A:
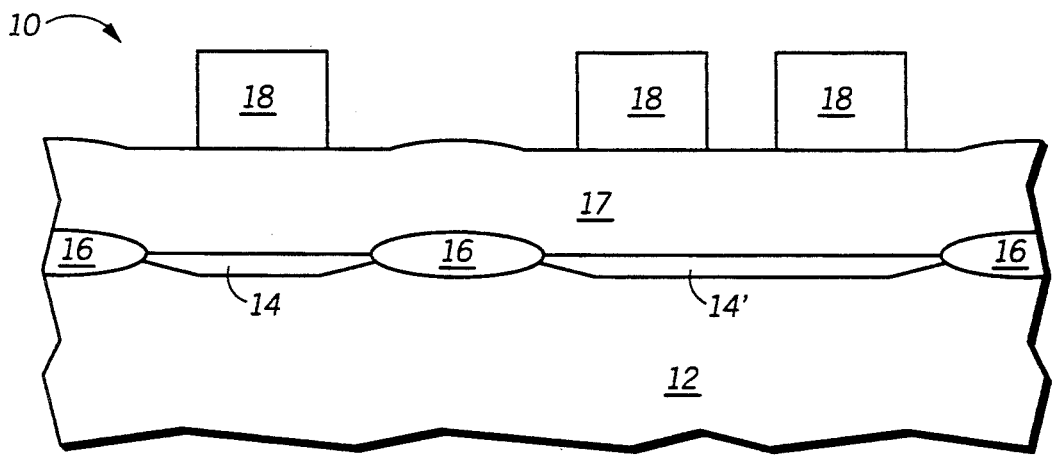
FIGS. 3A and 3B illustrate, in cross-sectional form, another embodiment for forming a control electrode region and first and second current regions of the transistor of FIG. 1.
Figure 3B:
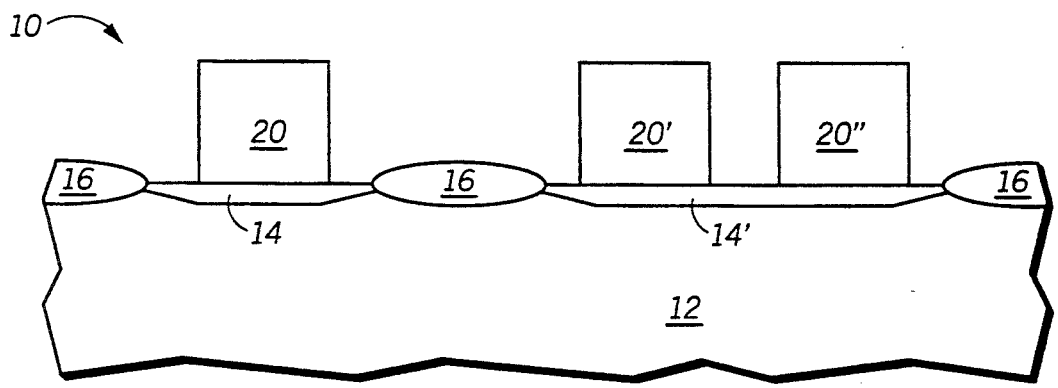

FIG. 2 illustrates a top elevation perspective view of device 10 to clarify the three-dimensional nature of device 10. The three regions 20, 20', and 20" are typically rectangular or spherically shaped, and all are formed from or physically placed near to the active areas 14 and 14'. Region 20 is surrounded and at least partially covered by gate layer 24. Epitaxial layer 20' is, at least partially, surrounded on its periphery by gate layer 24. The conductive layers 34, 34', and 34" make electrical connections on or around a periphery of the regions 20, 20', and 20". The conductive layers 34, 34', and 34" are used to electrically route voltages and currents to and from device 10 which is an FET device.

Figure 5A:
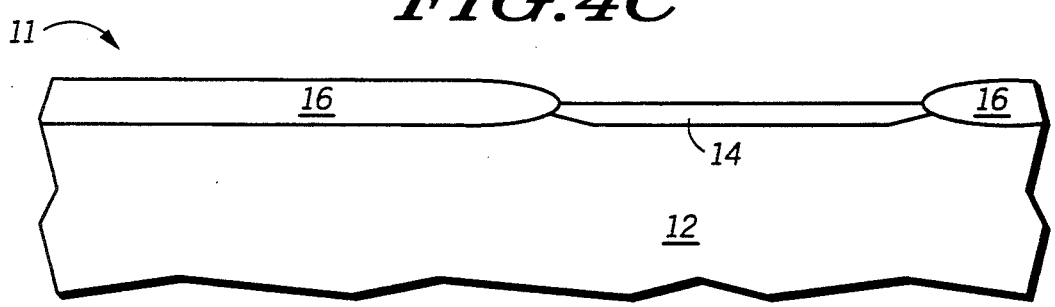
FIGS. 5A-5H illustrate, in cross-sectional form, an alternative form for making a field effect transistor in accordance with the present invention.
Figure 5B:
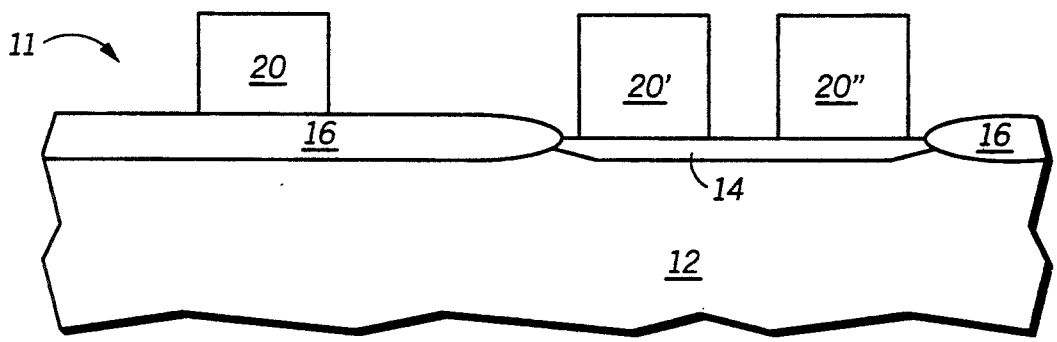
Figure 5C:
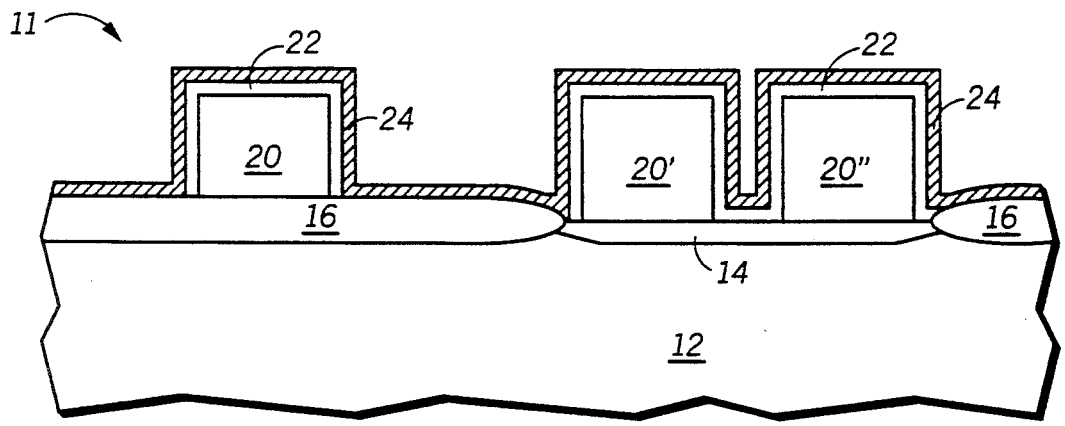

FIGS. 5A–5H illustrate a device 11 which is similar to device 10 with a notable exception being the physical placement of a gate-supporting region 20. For purposes of comparison, elements which are common between FIG. 1 and FIG. 5 are similarly numbered. Device 11 also has substrate 12, active area 14, and dielectric layer 16. For device 11, the region 20 depicted in FIG. 5B is positioned overlying the dielectric layer 16 and does not overlie the action region 14 as illustrated for device 10. A process flow for the fabrication of device 11 is very similar to the process flow for device 10. Therefore, the description of the fabrication of device 11 will be brief. This brief description should allow device 11 at the previously mentioned flexibility of device 10 in terms of formation, methods of formation and material composition even though it is not specifically stated below.

Figure 5D:
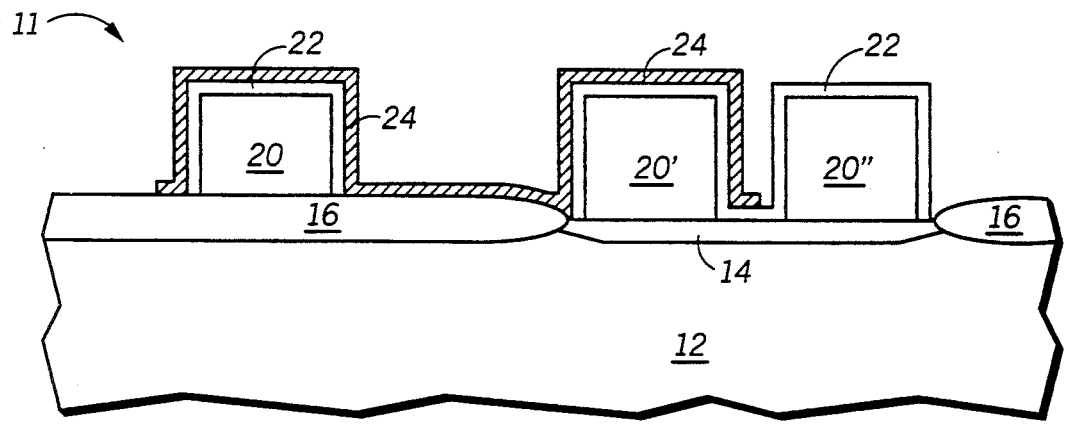
Figure 5E:
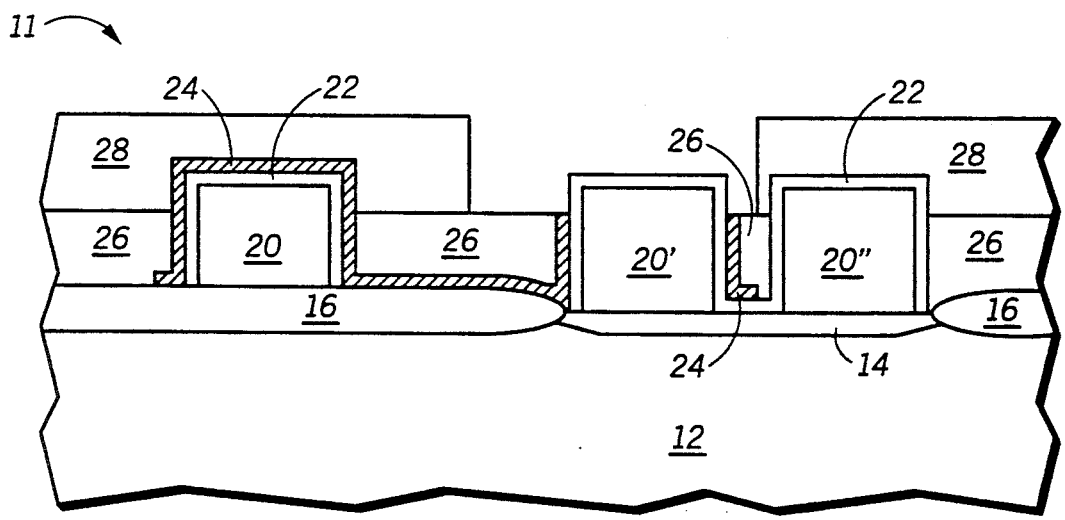
Figure 5F:
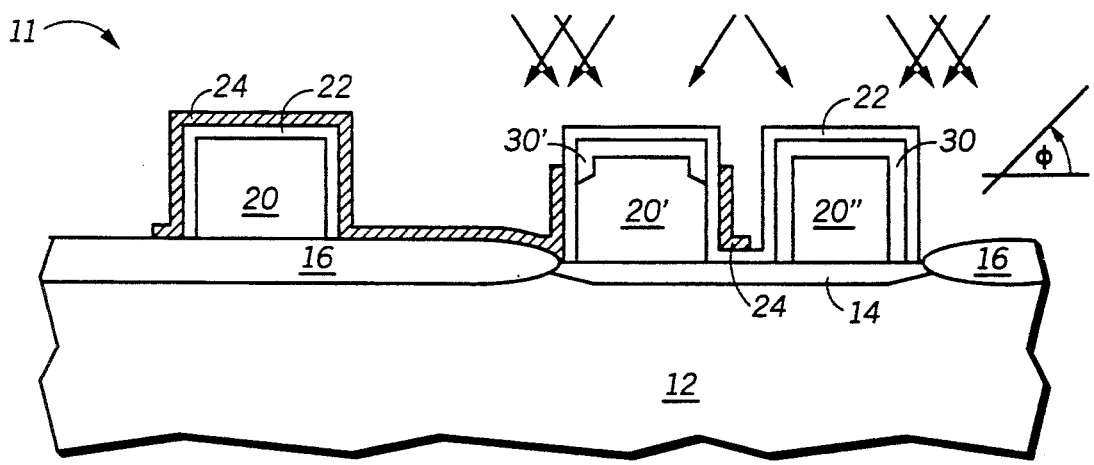
Figure 5G:
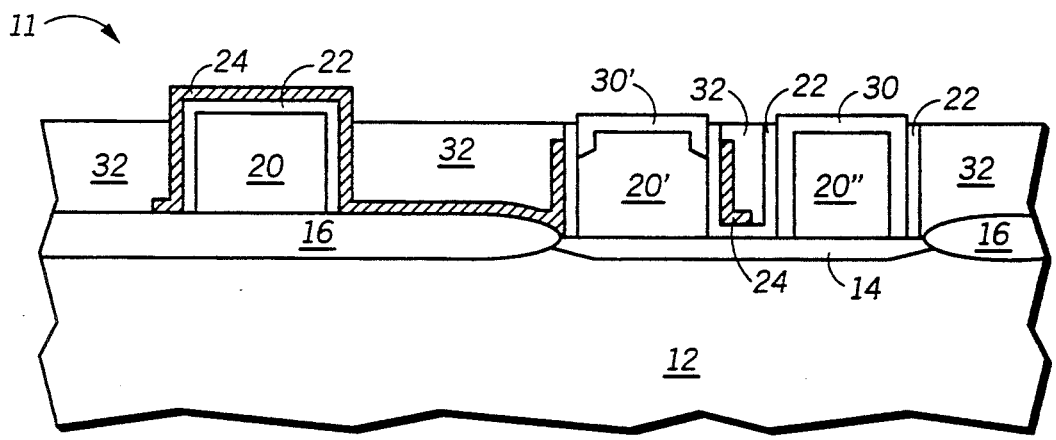
Figure 5H:
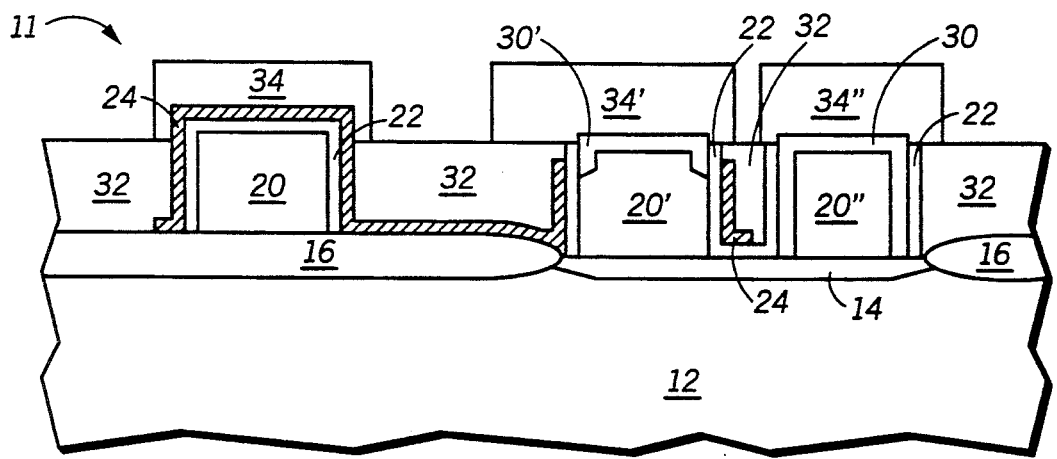

FIG. 5B illustrates the formation of the three previously discussed "pillar-like" formations referred to as regions 20, 20', and 20". Regions 20, 20', and 20" can be formed by processes similar to those described for FIGS. 3A–3B, FIGS. 4A–4C, or another process. Illustrated in FIG. 5C, dielectric layer 22 and gate layer 24 are formed overlying all exposed surfaces of device 11. Portions of gate layer 24 are removed in two steps, as illustrated in FIG. 5D and FIG. 5E, to form a gate for the FET from the remaining unetched portion gate layer 24. Masking layers 26 and 28, which are illustrated in FIG. 5E, are used to protect predetermined areas of underlying layers from the gate layer 24 removal procedures. FIG. 5F illustrates a forty-five to eighty degree angle, angle Φ, in connection with a rotational ion implant or a diffusion step that is used to form a source region 30 and a drain region 30'. FIG. 5G illustrates the formation of a region 32 which is a reflowed and/or planarized overlying layer of material. The planar overlying layer of material, referred to as region 32, is then etched back resulting in the exposure of gate layer 24 which overlies the region 20 and also results in the exposure of the source region 30 and the drain region 30'. FIG. 5H illustrates conductive layers 34, 34', and 34" which are respectively used to make electrical contact to the gate, source, and drain of device 11. The gate, source, and drain of device 11 are referred to as gate layer 24, source region 30 and drain region 30', respectively.

There is an important advantage to having the region 20 overlying dielectric layer 16. Unlike device 10, which has a capacitive coupling that is in some cases advantageous, device 11 reduces capacitive coupling for use in speed-critical applications wherein capacitive coupling is undesirable. This capacitive reduction is achieved by the fact that the dielectric layer 16 is vertically thick and has a known dielectric property of electrical isolation. Because underlying thick dielectrics reduce capacitive coupling, the gate layer 24 will have less known and understood capacitive coupling limitations that can result for FET devices. Also the potential for higher leakage current and electrical shorting during processing is reduced.

Figure 6:
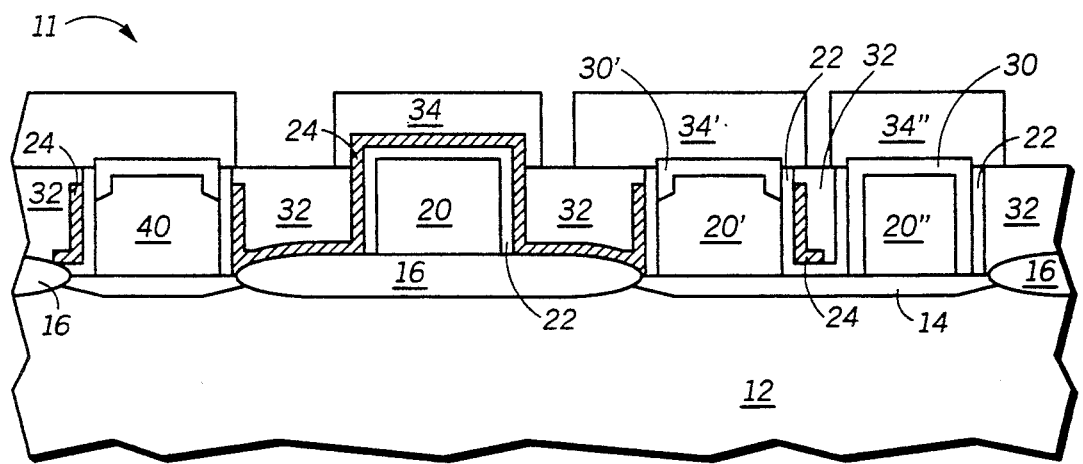
FIG. 6 illustrates in cross-sectional form an alternative gate structure of the field effect transistor of FIG. 5.

In another form of device 10, the gate created by resulting gate layer 24 could also function as a gate for another device. Referring briefly to FIG. 6, an example of the dual use of gate layer 24 is illustrated. For purposes of correlating FIGS. 1 and 6, similar elements are identically numbered. In FIG. 6 the gate layer 24 surrounds a region 20' and a region 40 of two different and separate devices. A single gate used to gate several devices is very useful for some applications such as the fabrication of complementary metal oxide semiconductor (CMOS) inverters, NOR gates and/or NAND gates.

Because device 10 and device 11 are vertical and epitaxial devices, device 10 and device 11 have all the advantages that were described herein for vertical transistors and epitaxial growth structures. In addition, the devices 10 and 11 also have very accurate capacitive coupling control and capacitive coupling reduction advantages for memory and speed-critical applications that were discussed herein. The inventive devices 10 and 11 and corresponding inventive processes also have several added advantages due to the regions 20, 20' and 20" being formed at the same relative physical height above the substrate. These added advantages are: (1) an easy to manufacture and reliable gate, source and drain contact to overlying conductive layers, such as metal layers (2) a polysilicon gate or conductive control electrode that does not hinder the impurity doping of the source and the drain while also functioning to protecting the channel region; and (3) a device that is capable of dimension reduction into smaller submicron ranges due to the fact that an overlying conductive layer does not have to flow into the topography of a small contact in order to make an electrical contact to devices 10 and 11.

While the present invention has been illustrated and described with reference to specific embodiments, further modifications and improvements will occur to those skilled in the art. For example, different materials can be used to perform the same function. The substrate could be silicon on sapphire (SOS), silicon (Si), germanium(Ge), gallium-arsenide (GaAs) or any other semiconductor material. Various layers illustrated herein can be formed of varying types of photoresists, polymers, oxides dielectrics, conductors, insulators, and dopants and still serve the same or similar function. Other technologies can be added to this device to further improve its usefulness, applications, or performance without parting from the scope of this invention. It is to be understood, therefore, that this invention is not limited to the particular forms illustrated and that it is intended in the appended claims to cover all modifications that do not depart from the spirit and scope of this invention.

We claim:

1. A process for forming a field effect transistor, comprising the steps of:
   providing a substrate material of a first conductivity type and having a surface;
   forming first and second regions of a second conductivity type in the substrate material;
   separating the first and second regions by a first insulator;
   forming a control electrode region and first and second current regions, said control electrode region overlying the first region in the substrate material, and said first and second current regions overlying the second region in the substrate material and separated from each other, the first current region being single crystalline, formed from the substrate material and having the first conductivity type, the control electrode region and first and second current regions being elevated above the surface of the substrate material;
   forming a second insulator overlying all exposed surfaces;
   forming a conductive material overlying the second insulator;
   removing the conductive material overlying the second current region;
   further removing the conductive material from an upper portion of the first current region to form a control electrode from a remainder of the conductive material;
   selectively doping a portion of the first and second current regions with the second conductivity type to respectively form a first current electrode and a second current electrode;
   defining a channel region around a perimeter of the first current region and between the first current electrode and the second region of the second conductivity type; and
   forming electrical contact to the control electrode and first and second current electrodes.

2. The process of claim 1 wherein the step of forming the control electrode region and the first and second current regions further comprises:
   a growing an epitaxial layer over all exposed surfaces of the first and second regions and the first insulator;
   forming a masking layer overlying the epitaxial layer;
   forming openings in the masking layer which expose portions of the epitaxial layer; and
   removing the epitaxial layer portions exposed by the masking layer openings to form the control electrode region and the first and second current regions.

3. The process of claim 1 wherein the step of forming the control electrode region and the first and second current regions further comprises:
   forming at least one layer of a masking material over all exposed surfaces of the first and second regions and the first insulator;
   forming openings in the masking material layer which expose portions of the surface of the substrate material;
   growing selective epitaxial formations from the exposed portions of the surface of the substrate material;
   removing the masking material layer; and
   using the selective epitaxial formations to form the control electrode region and the first and second current regions.

4. The process of claim 1 wherein the step of forming the first current region further comprises doping the first current region with dopant atoms to alter channel performance.

5. A process for forming a field effect transistor, comprising the steps of:
   providing a substrate material of a first conductivity type and having a surface;
   forming a first insulator overlying a predetermined portion of the substrate material;
   forming a region of a second conductivity type in the substrate material and adjacent to the first insulator;
   forming a control electrode region overlying the first insulator, and forming first and second current regions overlying the region of second conductivity type and separated from each other, the first current region being epitaxially grown from the substrate material and having the first conductivity type, the control electrode region and first and second current regions being elevated above the surface of the substrate material;
   forming a second insulator overlying all exposed surfaces;
   forming a conductive material overlying the second insulator;
   removing the conductive material overlying the second current region;
   further removing the conductive material from an upper portion of the first current region for forming a control electrode from the conductive material;
   selectively doping a portion of the first and second current region with the second conductivity type to respectively form a first current electrode and a second current electrode;
   defining a channel region around a perimeter of the first current region and between the first current electrode and the region of second conductivity type; and
   forming electrical contact to the control electrode and first and second current electrodes.

6. The process of claim 5 wherein the step of forming the control electrode region and the first and second current regions further comprises:
   growing an epitaxial layer over all exposed surfaces of the first and second regions, and the first insulator;
   forming a masking layer overlying the epitaxial layer;
   forming openings in the masking layer which expose portions of the epitaxial layer; and
   removing the epitaxial layer portions exposed by the masking layer openings to form the control electrode region and the first and second current regions.

7. The process of claim 5 wherein the step of forming the control electrode region and the first and second current regions further comprises:
   forming at least one layer of a masking material over all exposed surfaces of the first and second regions and the first insulator;

forming openings in the masking material layer which expose portions of the surface of the substrate material;

growing selective epitaxial formations from the exposed portions of the surface of the substrate material;

removing the masking material layer; and using the selective epitaxial formations to form the control electrode region and the first and second current regions.

8. The process of claim 5 wherein the step of forming the first current region further comprises doping the first current region with dopant atoms to alter channel performance.

* * * * *